United States Patent
Xu et al.

(10) Patent No.: US 11,072,853 B2
(45) Date of Patent: Jul. 27, 2021

(54) HIGH-DUCTILITY PERIODIC VARIABLE ALLOY PROTECTIVE FILM AND FORMING METHOD THEREOF

(71) Applicant: CITIC Dicastal CO., LTD., Hebei (CN)

(72) Inventors: Zuo Xu, Qinhuangdao (CN); Guoyuan Xiong, Qinhuangdao (CN); Zaide Wang, Qinhuangdao (CN); Huanming Ma, Qinhuangdao (CN); Shengchao Zhang, Qinhuangdao (CN); Shuai Li, Qinhuangdao (CN); Qingwang Wei, Qinhuangdao (CN); Chuanming Li, Qinhuangdao (CN)

(73) Assignee: CITIC DICASTAL CO., LTD, Qinhuangdao (CN)

( * ) Notice: Subject to any disclaimer, the term of this patent is extended or adjusted under 35 U.S.C. 154(b) by 26 days.

(21) Appl. No.: 16/223,320

(22) Filed: Dec. 18, 2018

(65) Prior Publication Data
US 2019/0292655 A1  Sep. 26, 2019

(30) Foreign Application Priority Data
Mar. 21, 2018 (CN) .......................... 201810232390.3

(51) Int. Cl.
| | | |
|---|---|---|
| B05D 1/06 | (2006.01) | |
| B05D 3/12 | (2006.01) | |
| B05D 1/38 | (2006.01) | |
| B05D 7/14 | (2006.01) | |
| B05D 7/16 | (2006.01) | |
| C23C 14/14 | (2006.01) | |
| C23C 14/20 | (2006.01) | |
| C23C 14/35 | (2006.01) | |
| B05D 3/10 | (2006.01) | |
| B05D 5/06 | (2006.01) | |
| B05D 7/00 | (2006.01) | |
| C23C 14/02 | (2006.01) | |

(52) U.S. Cl.
CPC ............ *C23C 14/352* (2013.01); *B05D 3/102* (2013.01); *B05D 3/108* (2013.01); *B05D 5/061* (2013.01); *B05D 7/16* (2013.01); *B05D 7/51* (2013.01); *B05D 7/536* (2013.01); *B05D 7/576* (2013.01); *C23C 14/021* (2013.01); *C23C 14/024* (2013.01); *C23C 14/028* (2013.01); *C23C 14/20* (2013.01); *C23C 14/205* (2013.01); *B05D 1/06* (2013.01); *B05D 3/12* (2013.01); *B05D 2202/25* (2013.01); *B05D 2502/00* (2013.01); *B05D 2504/00* (2013.01); *B05D 2508/00* (2013.01)

(58) Field of Classification Search
None
See application file for complete search history.

(56) References Cited

U.S. PATENT DOCUMENTS

| | | | |
|---|---|---|---|
| 4,432,247 A | 2/1984 | Takeno | |
| 4,524,106 A | 6/1985 | Flasck | |
| 6,399,152 B1 | 6/2002 | Goodrich | |
| 6,767,435 B1 | 7/2004 | Kitagawa | |
| 2002/0131656 A1 | 9/2002 | Knepper | |
| 2002/0170460 A1 | 11/2002 | Goodrich | |
| 2005/0067273 A1* | 3/2005 | Goodrich | C23C 28/021 204/192.15 |
| 2005/0073047 A1 | 4/2005 | Miura | |
| 2005/0282003 A1 | 12/2005 | Mayzel | |
| 2009/0324937 A1 | 12/2009 | Lev | |
| 2015/0225839 A1 | 8/2015 | Visker et al. | |
| 2019/0284702 A1 | 9/2019 | Wang et al. | |
| 2019/0292655 A1 | 9/2019 | Wang et al. | |

FOREIGN PATENT DOCUMENTS

| | | |
|---|---|---|
| CN | 1357930 A | 7/2002 |
| CN | 101240423 A | 8/2008 |
| CN | 101294270 A | 10/2008 |
| CN | 101343740 A | 1/2009 |
| CN | 102381134 A | 3/2012 |
| CN | 102383101 A | 3/2012 |
| CN | 102725364 A | 10/2012 |
| CN | 102728529 A | 10/2012 |
| CN | 103613286 A | 3/2014 |
| CN | 103668071 A | 3/2014 |
| CN | 104669712 A | 6/2015 |
| CN | 105525266 A | 4/2016 |
| CN | 106435489 A | 2/2017 |

(Continued)

OTHER PUBLICATIONS

European Search Report in the European application No. 19162983.1, dated Jul. 17, 2019, 16 pgs.

(Continued)

*Primary Examiner* — Sheeba Ahmed
(74) *Attorney, Agent, or Firm* — Cooper Legal Group, LLC

(57) ABSTRACT

The disclosure provides a metal protective layer, sequentially comprising an organic powder coating, a high-gloss organic coating, a ductile periodic variable alloy protective film and a transparent powder coating, wherein the base powder layer is an epoxy resin or pure polyester powder coating; the high-gloss organic coating is an epoxy resin powder coating, a polyester powder coating, or a polybutadiene organic coating; the ductile periodic variable alloy protective film is formed by direct current magnetron sputtering with two targets in a high vacuum environment, and the material of the targets is composed of a Ni—Cr alloy layer and pure Cr; and the transparent powder layer is an acrylic powder coating or a polyester transparent powder coating.

8 Claims, 1 Drawing Sheet

(56) References Cited

FOREIGN PATENT DOCUMENTS

| | | |
|---|---|---|
| CN | 106435584 A | 2/2017 |
| CN | 106694344 A | 5/2017 |
| CN | 206428322 U | 8/2017 |
| CN | 10761804 A | 1/2018 |
| CN | 108531854 A | 9/2018 |
| CN | 108546910 A | 9/2018 |
| EP | 1337684 A1 | 8/2003 |
| JP | H04103777 A | 4/1992 |

OTHER PUBLICATIONS

Pure definition. Google search. [https://www.goole.com/search?q=pure+definition&rlz=1C1GCEB_en&oq=pure&aqs=chrome.1.69i59l2j69i57j0l2j69i60l3.2455j0j1&sourceid=chrome&ie=UTF-8]. Cited in U.S. Appl. No. 16/223,346, 2 pgs.

Pure definition. Merriam-Webster Online Dictionary. [https://www.merriam-webster.com/dictionary/pure]. Cited in U.S. Appl. No. 16/223,346, 1 pg.

European Search Report in the European application No. 19161940.2, dated Jul. 17, 2019, 16 pgs.

European Search Report in the European application No. 19162979.9, dated Jul. 17, 2019, 16 pgs.

"Formation of a zirconium-titanium based conversion layer on AA 6060 aluminum"; 2002, J.H. Nordlien, J.C. Walmsley, H. Osterberg and K. Nisancioglu; Surface and Coatings Technology, vol. 153, pp. 72-78.

First Office Action of the U.S. Appl. No. 16/552,115, dated Apr. 28, 2021, 23 pgs.

\* cited by examiner

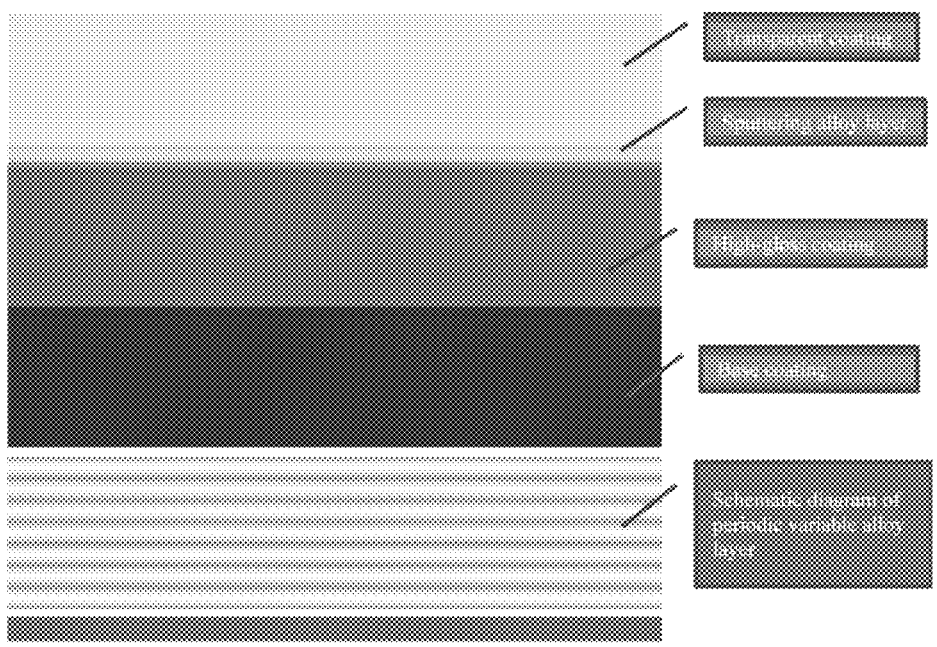

HIGH-DUCTILITY PERIODIC VARIABLE ALLOY PROTECTIVE FILM AND FORMING METHOD THEREOF

CROSS-REFERENCE TO RELATED APPLICATIONS

This application is filed based upon and claims priority to Chinese Patent Application No. 201810232390.3, filed Mar. 21, 2018, the contents of which are hereby incorporated by reference in its entirety.

BACKGROUND

At present, the surface treatment by physical vapor deposition (PVD) mainly includes evaporation, plasma multi-arc sputtering, and high-vacuum direct current magnetron sputtering. The high-vacuum direct current magnetron sputtering can be used in the manufacturing industry of automotive parts, including surface treatment and decoration on automobile logos, automobile hub caps, automobile hubs and other parts. It has the characteristics that the surface of a part can achieve the metallic white bright mirror gloss decoration effect and is attractive, the coating performance can reach the standards of the automobile factory, and compared with the conventional method of spraying base powder, color paint and transparent paint, the coating performance is equivalent but the appearance can achieve the plating effect.

The high-vacuum direct current magnetron sputtering is such a method that working gas is ionized in a vacuum chamber, the ionized ions bombard a metal target at a high speed under the mixed field action of an electric field and a magnetic field, and the metal atoms or ions on the target splash out and are deposited and sputtered on the surface of a workpiece. This method can achieve a new effect of metallic appearance of a glossy mirror, and is environment-friendly and broad in prospect. If a single-metal or single-alloy high-vacuum direct current magnetron sputtering film must meet the corrosion resistance standards of the main machine factory coating, it is necessary to select an inert metal or alloy with strong corrosion resistance. When the sputtering film is well combined with the upper and lower organic coatings and the coatings are cured, thermal expansion and contraction are produced, and the ductility of the film should meet the requirements, otherwise, cracks may occur, and the appearance cannot meet the requirements.

SUMMARY

The disclosure relates to the field of surface treatment of periodic alloy protective films, and specifically relates to a high-vacuum direct current magnetron sputtering periodic variable alloy protective film and a method for forming the alloy protective film.

Disclosed herein is a high-ductility periodic variable alloy protective film and a method for forming the alloy protective film.

A high-ductility periodic variable alloy protective film sequentially comprises a metal or non-metal substrate, a high-gloss organic resin coating, a high-ductility periodic variable alloy film and a transparent resin film. The high-gloss organic resin coating may be an epoxy resin coating, an acrylic resin coating, a pure polyester coating, or a polybutadiene coating; the high-ductility periodic variable alloy protective film is formed by direct current magnetron sputtering in a high vacuum environment, and the material of the sputtering target is composed of a NiCr alloy layer and pure Cr; and the transparent resin film is a pure acrylic resin coating.

The high-ductility periodic variable alloy protective film is composed of two metal elements Ni and Cr, and contains 80%-0 of Ni and 20%-100% of Cr, which are varied cyclically and gradually, in which the percentage of each metal element various with the thickness of the coating, and the high-ductility periodic variable alloy protective film of the disclosure is an alloy film periodically variable from the surface layer to the bottom.

The high-gloss organic resin coating has the thickness of 100-300 μm.

The Ni and Cr high-ductility periodic variable alloy protective film is 0.100-0.800 μm.

The acrylic layer has the thickness of 80-50 μm.

The disclosure further discloses a method for forming the high-ductility periodic variable alloy protective film, comprising the steps of:

(1) pretreating an aluminum alloy surface or other metal surface, comprising the steps of water washing, alkaline washing, water washing, acid washing, pure water washing, passivation, pure water washing, sealing, pure water washing and drying;

(2) spraying base powder onto the metal surface and curing same, the base powder being an epoxy resin powder or pure polyester powder coating;

(3) performing fine grinding and polishing on the surface of step (2);

(4) cleaning the surface of step (3), comprising the steps of water washing, alkaline washing, water washing, acid washing, pure water washing, pure water washing and drying;

(5) spraying a high-gloss and high-leveling resin powder coating or a solvent-type liquid paint onto the surface of step (4), and curing same, the base paint being epoxy resin powder, a polyester powder coating or a polybutadiene liquid coating;

(6) performing high-vacuum direct current magnetron sputtering on the surface of step (5), the sputtering comprising simultaneous opening of a NiCr alloy target and a pure Cr metal target and simultaneous auto-rotation and revolution to obtain a periodic variable alloy protective film; and (7) spraying transparent powder onto the surface of step (6) and curing same, the transparent powder being acrylic resin or a polyester powder coating.

In step (2), the base powder is sprayed with a thickness of 100-300 μm, the hub surface curing temperature is 190° C., and the curing time is 20 min.

In step (3), 800/1000-mesh sandpaper is used for grinding in the fine grinding step, and surface defects and unevenness are ground without exposing the metal substrate.

In step (5), the high-gloss organic coating has the thickness of 80-120 μm, the spoke surface curing temperature is 220° C., and the curing time is 20 min.

In step (6), the workpiece coating temperature is 80-150° C., the flow rate of gas is 40-80 cc/min, the coating direct current is 20-30 A, and the direct current voltage is less than or equal to 800 v; the vacuum degree is $(2-8) \times 10^{-3}$ Pa, the double target coating time is 15-40 s, the working gas is 99.999% argon, and the coating ambient humidity is less than or equal to 50%.

In step (7), the transparent powder is sprayed with a thickness of 80-150 μm, the hub surface curing temperature is 175° C., and the curing time is 20 min.

The high-ductility periodic variable alloy protective film and the method according to the disclosure have the advantages of (1) eliminating the residual stress of the deposited metal layer, improving the stability of the sputtering alloy and the ductility of the film, and avoiding the problem of cracking during rapid heating and rapid cooling of the film; (2) improving the bonding force between the metal film and the underlying high-gloss resin material; (3) improving the bonding force between the film and the surface transparent coating and the durability of the bonding force; (4) forming a bright metal appearance of metallic chromium, and achieving a decoration effect; and (5) the coating system having good corrosion resistance. The original PVD chrome plating layer has high physical brittleness due to the single metal, and cracks in rapid cooling and rapid heating after being bonded with the organic coating, affecting the bonding force with the organic coating. The above problems are basically solved after adopting this new periodic variable alloy process. The technical solution of the disclosure can also be applied to other purposes such as notebook cases, car interior trims and sanitary fittings.

BRIEF DESCRIPTION OF THE DRAWINGS

FIG. 1 shows the schematic diagram of the high-ductility periodic variable alloy protective film.

DETAILED DESCRIPTION

Unless otherwise specified, the embodiments of the disclosure adopt two targets, one is NiCr alloy containing 60%-80% of Ni and 20%-80% of Cr by mass, and the other one is Cr having the purity of 99.99%. The PVD equipment is a high vacuum magnetron sputtering coating machine.

The sputtering base material is A356.2 aluminum alloy; the base powder is a pure polyester powder coating; the high-gloss powder coating is a pure epoxy resin coating; and the transparent coating is a pure acrylic transparent powder coating.

The coating is inspected in accordance with the US general motor hub coating performance standards, and the inspection items include Adhesion Cross-Cut Test, CASS, FLIFORM, NASS, tape sticking test, high humidity resistance test, gravel impact test, thermal shock resistance test, oil resistance test, detergent resistance test, aging resistance test, etc.

A method of forming a high-ductility periodic variable alloy protective film includes the steps of:

(1) providing an aluminum alloy surface or other metal surface for pretreatment, the pretreatment including water washing, alkaline washing, water washing, acid washing, pure water washing, passivation, pure water washing, sealing, pure water washing and drying;

(2) spraying base powder onto the metal surface of step (1) and curing same, the base powder being an epoxy resin powder or pure polyester powder coating; (3) performing fine grinding and polishing on the surface of step (2);

(4) cleaning the surface of step (3), including the steps of water washing, alkaline washing, water washing, acid washing, pure water washing, pure water washing and drying;

(5) spraying a high-gloss and high-leveling resin powder coating or a solvent-type liquid paint onto the surface of step (4), and curing same, the base paint being epoxy resin powder, a polyester powder coating or a polybutadiene liquid coating;

(6) performing high-vacuum direct current magnetron sputtering on the surface of step (5), the sputtering including simultaneous opening of a NiCr alloy target and a pure Cr metal target and simultaneous auto-rotation and revolution to obtain a periodic variable alloy protective film; and (7) spraying transparent powder onto the surface of step (6) and curing same, the transparent powder being acrylic resin or a polyester powder coating.

In step (2), the powder spraying thickness is 100-300 μm, the curing temperature on the surface of the workpiece reaches 180° C., and the curing time is 20 min.

In step (3), 800/1000-mesh sandpaper is used for grinding and polishing in the fine grinding step.

In step (5), the base paint is sprayed with a thickness of 80-120 μm, the curing temperature on the surface of the workpiece reaches 215° C., and the curing time is 20 min.

In step (6), the workpiece coating temperature is 80-150° C., the flow rate of gas is 40-80 cc/min, the coating direct current is 20-30 A, and the direct current voltage is less than or equal to 800 v; the vacuum degree is $(2-8) \times 10^{-3}$ Pa, the double target coating time is 15-80 s, the working gas is 99.999% argon, and the coating ambient humidity is less than or equal to 50%.

In step (7), the transparent powder is sprayed with a thickness of 80-150 μm, the curing temperature on the surface of the workpiece reaches 180° C., and the curing time is 17 min.

Comparative Example 1

A PVD protective layer is prepared using a common method in the art. The target is a pure Cr single target. The adopted process method and coating structure are same as those of the preparation method of the disclosure.

Comparative Example 2

A PVD protective layer is prepared using a common method in the art. The target is a NiCr alloy single target. The adopted process method and coating structure are same as those of the preparation method of the disclosure.

The metal surface ductility periodic high-vacuum magnetron sputtering coatings in Embodiment 1 and Comparative Examples 1 and 2 are tested and compared as the following table:

| | Group | | |
|---|---|---|---|
| | Embodiment 1 | Comparative Example 1 | Comparative Example 2 |
| Surface cracking | No cracking | Intensive cracking | Cracking |
| Adhesion Cross-Cut Test | 100% shedding-free | 93% shedding-free | 92% shedding-free |
| Tape sticking test | 100% shedding-free | 95% shedding-free | 92% shedding-free |
| CASS | 2.0 mm | 3.1 mm | 6.1 mm |
| FLIFORM | 3.3 mm | 4.1 mm | 4.8 mm |
| NASS | 1.8 mm | 2.2 mm | 5.2 mm |
| Water resistance test | No change, adhesion 100% shedding-free | No change, adhesion 85% shedding-free | No change, adhesion 67% shedding-free |
| Gravel impact resistance | Superior to level 8 | Level 8 | Level 8 |
| Thermal impact | Shedding-free | 10% shedding | 13% shedding |
| Oil resistance test | No change | No change | No change |
| Detergent resistance | No change | No change | No change |

-continued

| | Group | | |
|---|---|---|---|
| | Embodiment 1 | Comparative Example 1 | Comparative Example 2 |
| Aging resistance | No change, adhesion 100% shedding-free | No change, adhesion 91% shedding-free | No change, adhesion 90% shedding-free |

Hence, in the method of the disclosure, the coating temperature, the argon flow rate, the coating current, the vacuum degree, the NiCr alloy target and the pure Cr coating time are the key parameters. A PVD film with good properties is obtained by optimizing the above process. In the disclosure, the technical solution of the embodiment obtains the optimal condition by exploring the above conditions. The coating test results are best under this optimal condition.

The disclosure discloses a high-ductility periodic variable alloy protective film, sequentially comprising a metal or non-metal substrate, a high-gloss organic resin coating, a high-ductility periodic variable alloy film and a transparent resin film. The disclosure also provides a forming method of the high-ductility periodic variable alloy protective film. The method can improve the bonding force between the coating film and the surface transparent coating and the durability of the bonding force, and form a bright metal appearance of metallic chrome, and the coating system has good corrosion resistance.

The invention claimed is:

1. A protective film, sequentially consisting of:
   a base powder layer,
   a high-gloss organic coating,
   a ductile periodic variable alloy protective film, and
   a transparent powder coating, wherein:
   the base powder layer is an epoxy resin or a pure polyester powder coating;
   the high-gloss organic coating is an epoxy resin powder coating, a polyester powder coating, or a polybutadiene organic coating;
   the ductile periodic variable alloy protective film is formed by simultaneously opening two targets and performing direct current magnetron sputtering in a high vacuum environment, and the two targets are a Ni—Cr alloy target and a pure Cr metal target, wherein a Ni content periodically varies from more than 0% to 85% by mass and a Cr content periodically varies from 15% to 100% by mass in the ductile periodic variable alloy protective film; and
   the transparent powder coating is an acrylic powder coating or a polyester transparent powder coating.

2. The protective film according to claim 1, wherein a thickness of the base powder layer is 100-300 µm; a thickness of the high-gloss organic coating is 80-120 µm; a thickness of the transparent powder coating is 80-150 µm; and a thickness of the ductile periodic variable alloy protective film is 0.1-0.8 µm.

3. A method for forming the protective film of claim 1, comprising steps of:

(1) providing a surface of a workpiece made of an aluminum alloy or other metal for pretreatment, the pretreatment comprising steps of water washing, alkaline washing, water washing, acid washing, pure water washing, passivation, pure water washing, sealing, pure water washing and drying;
(2) spraying base powder onto the surface of step (1) and curing same to obtain the base powder layer, the base powder being an epoxy resin powder or the pure polyester powder coating;
(3) performing fine grinding and polishing the surface of step (2);
(4) cleaning the surface of step (3), comprising steps of water washing, alkaline washing, water washing, acid washing, pure water washing, pure water washing and drying;
(5) spraying a high-gloss and high-leveling resin powder coating or a solvent-type liquid paint onto the surface of step (4), and curing same to obtain the high-gloss organic coating, the high-gloss and high-leveling resin powder coating or the solvent-type liquid paint being epoxy resin powder, the polyester powder coating or the polybutadiene organic coating;
(6) performing the direct current magnetron sputtering on the surface of step (5), the sputtering comprising simultaneous opening of the Ni—Cr alloy target and the pure Cr metal target and simultaneous auto-rotation and revolution to obtain the ductile periodic variable alloy protective film; and
(7) spraying transparent powder onto the surface of step (6) and curing same to obtain the transparent powder coating, the transparent powder being acrylic resin or the polyester transparent powder coating.

4. The method according to claim 3, wherein in step (2), a powder spraying thickness is 100-300 µm, a curing temperature on the surface of the workpiece reaches 180° C., and a curing time is 20 min.

5. The method according to claim 3, wherein in step (3), 800/1000-mesh sandpaper is used for grinding and polishing in the fine grinding step.

6. The method according to claim 3, wherein in step (5), the high-gloss organic coating is sprayed with a thickness of 80-120 µm, a curing temperature on the surface of the workpiece reaches 215° C., and a curing time is 20 min.

7. The method according to claim 3, wherein in step (6), a temperature of the workpiece for the sputtering is 80-140° C., a flow rate of gas is 40-80 cc/min, a direct current for the sputtering is 20-30 A, and a voltage of a direct current power supply is less than or equal to 800 v; a vacuum degree is $(2-8) \times 10^{-3}$ Pa, a sputtering time of the two targets is 15-80 s, a working gas is 99.999% argon, and an ambient humidity for the sputtering is less than or equal to 50%.

8. The method according to claim 3, wherein in step (7), the transparent powder is sprayed with a thickness of 80-150 µm, a curing temperature on the surface of the workpiece reaches 180° C., and a curing time is 17.

\* \* \* \* \*